United States Patent [19]
Erickson et al.

[11] Patent Number: 5,990,704
[45] Date of Patent: Nov. 23, 1999

[54] INTERNAL DRIVE CIRCUIT PROVIDING THIRD INPUT PIN STATE

[75] Inventors: Charles R. Erickson, Fremont; Brian D. Erickson, Soquel, both of Calif.

[73] Assignee: Xilinx, Inc., San Jose, Calif.

[21] Appl. No.: 08/942,858

[22] Filed: Oct. 2, 1997

[51] Int. Cl.[6] .................... H03K 19/0175; H03K 19/20
[52] U.S. Cl. ............................................. 326/56; 327/162
[58] Field of Search ................................. 326/37, 38, 46, 326/56–58, 59, 99, 136; 327/162

[56] References Cited

U.S. PATENT DOCUMENTS 4,031,410  6/1977  Kikuchi ............................... 326/56 X

*Primary Examiner*—David Mis
*Attorney, Agent, or Firm*—Adam H. Tachner, Esq.; Crosby, Heafey, Roach & May; Lori D. Cartier

[57] ABSTRACT

A multi-state input drive structure is provided to forward externally generated high and low input signals, as well as to receive at least a third, internally generated, comparatively weak signal, preferably an oscillating signal, which triggers a third internally forwarded signal when neither of the high and low input signals is received. The inventive circuit drives three internally forwarded output signals from a single external signal source. Since this circuit may be duplicated for every pin on a device for which two cycle delays do not affect performance, availability of a third input state on N inputs allows $3^N$ input codes as opposed to $2^N$ for the conventional "high" and "low" levels normally available.

14 Claims, 5 Drawing Sheets

INTERNAL DRIVE CIRCUIT PROVIDING THIRD INPUT PIN STATE

FIELD OF THE INVENTION

The present invention is related generally to the field of integrated circuits and more specifically to an input/output ("I/O") architecture in a binary system providing a third, reliable input state.

BACKGROUND OF THE INVENTION

Integrated circuits have achieved widespread use due in part to their utility in reducing the space required to achieve a given electrical function, with an attendant increase in performance including a reduction in power requirements.

As integrated circuit device sizes decrease and capabilities increase, space available for growing I/O needs decreases. Thus, I/O pins are considered a valuable device resource to be used in only the most efficient manner possible.

One basic feature of all widely used integrated circuits is the use of a binary voltage system. The voltage differential (typically 3 to 5 volts) between logic high and logic low provides an error buffer to ensure that even noisy voltage signals accurately communicate the desired binary I/O signal.

As shown in FIG. 1, a prior art input circuit is normally a simple pad connected to a signal buffer 10 that forwards the signal as appropriate for the device. This circuit merely forwards a received binary signal from an I/O pin without adding any functionality to that signal or the pin from which it is forwarded.

One limitation of the generally accepted binary signal input format is the need for a plurality of physical I/O connections to provide more than two signal options to a device. For example, three clock speed options are selectable by providing the user access to at least two pins for carrying binary signals. Similarly, in the field of Programmable Logic Devices, and particularly Field Programmable Gate Arrays, at least three binary configuration mode selection pins are needed to provide eight ($2^3$) configuration mode options.

In another available circuit, two or more input buffers with different thresholds are provided to receive the input signal. Such a circuit may include one buffer having a low threshold (e.g., 1.5 volts) and second buffer having a higher threshold (e.g., 3.0 volts). Three logic states can then be derived from the buffer outputs, corresponding to input signal levels 0 to 1.5 volts, 1.5 to 3.0 volts, and above 3.0 volts. However, such a circuit narrows the margin of error for accurately reading unstable input signals and requires additional control logic for the input signal source to distinguish the three voltage levels.

Thus, a circuit which enhances the functionality of binary input signals and binary I/O structures without narrowing the margin of error or increasing the number of pins would be advantageous.

SUMMARY OF THE INVENTION

To address the shortcomings of the available art, a multi-state input drive structure is provided to forward externally generated high and low input signals as well as to receive at least a third, internally generated, comparatively weak signal, preferably an oscillating signal, which triggers a third internally forwarded signal when neither of the high and low input signals is received (i.e., when a line carrying the externally generated input signal is in a high impedance state). The circuit of the present invention therefore drives three internally forwarded output signals from a single external signal source.

The present invention provides an integrated circuit device input circuit which enables the creation of more than two input states from a single external signal source. A device input circuit is provided that is sensitive to an externally created input signal, as well as to an internally-created test signal that triggers a third input state. Viewed from another aspect, the present invention provides an input circuit having two input states that can override a third input state, each of the two input states being triggered by a single external signal. Availability of a third input state on N inputs allows $3^N$ input codes as opposed to $2^N$ for the conventional "high" and "low" levels normally available.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF A PREFERRED EMBODIMENT

Figure 1:
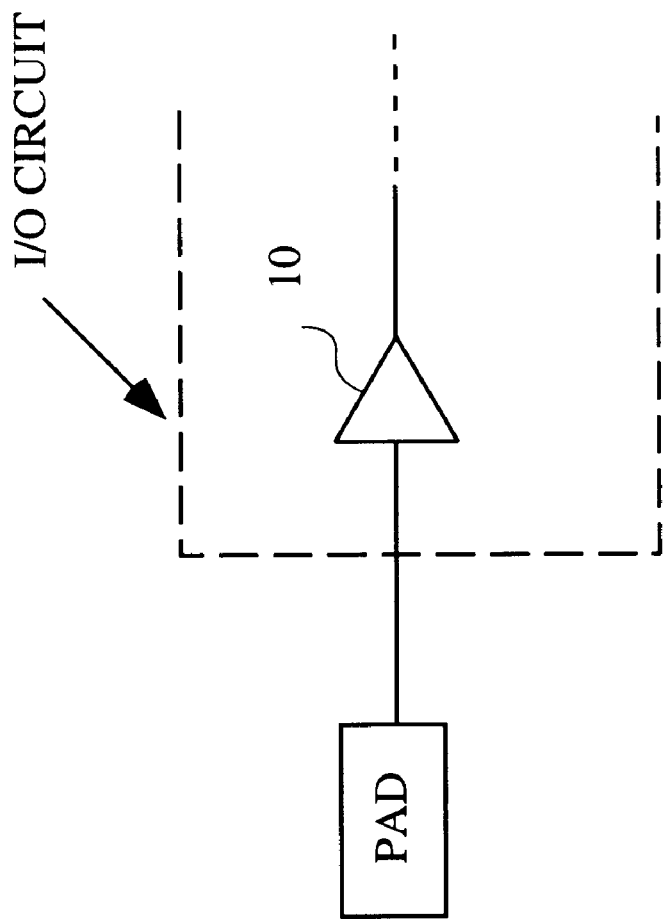
FIG. 1 illustrates a prior art circuit from an integrated circuit device I/O block.
Figure 2:
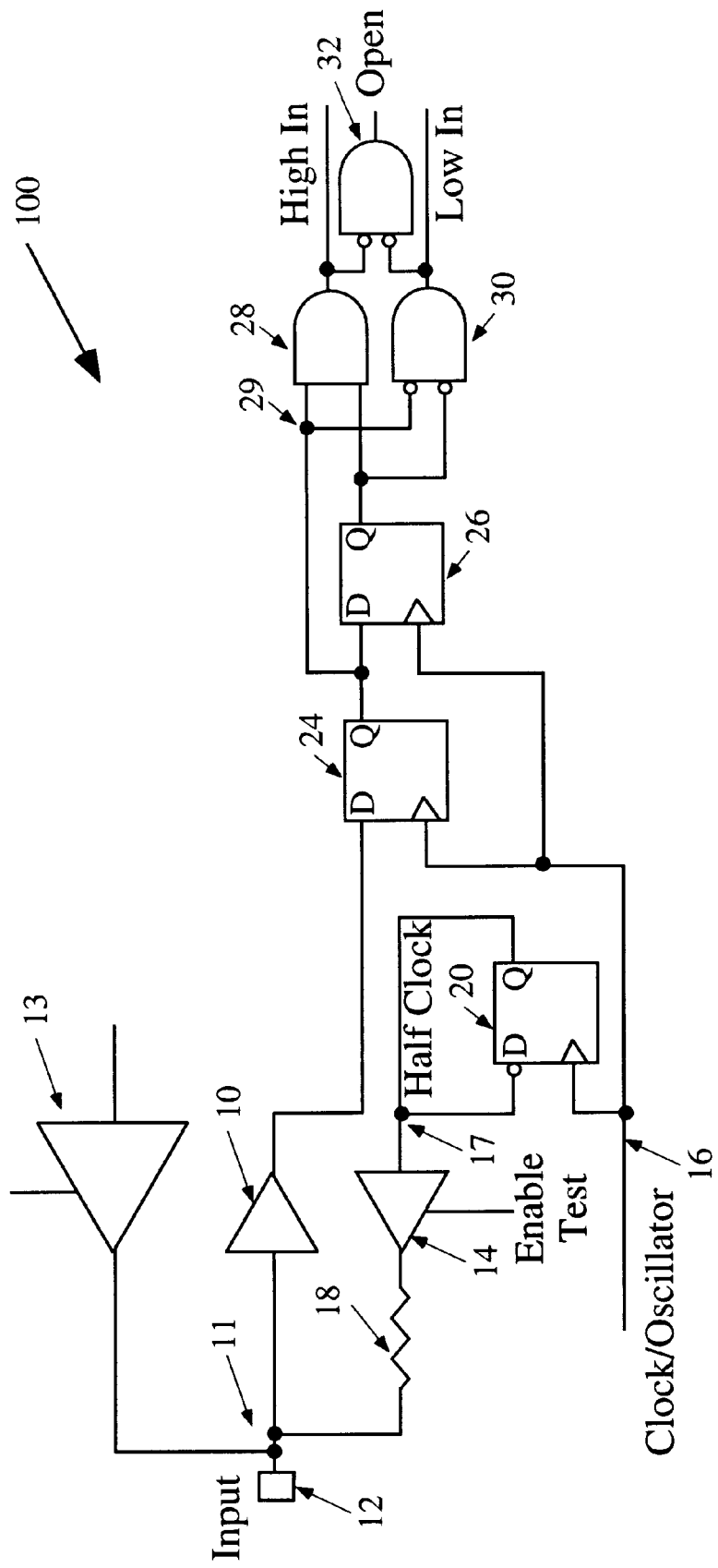
FIG. 2 illustrates a preferred embodiment of the present invention.

A preferred embodiment of the present invention is illustrated in FIG. 2. Circuit 100 on an integrated circuit device includes I/O pad 12 connected to input buffer 10 at node 11. Output tri-state buffer 13 is also attached to pad 12 at node 11, but plays no role in the proper function of the present invention. Tri-state buffer 14 is also connected, across resistive element 18, to pad 12 and to the input of buffer 10 at node 11. The output of buffer 10 is connected to the input of D-type flip-flop 24. Flip-flops 24, 20 and 26 are all clocked by an oscillating signal, received across line 16 from a source (not shown) such as a clock circuit within the device. In an alternative embodiment, signal 16 may be derived from an input pad other than pad 12. The output of flip-flop 24 is connected to AND gate 28 as well as to the data input of flip-flop 26 and, in inverted form, to AND gate 30. The output of flip-flop 26 is connected to AND gate 28, and, in inverted form, to AND gate 30. The outputs of both AND gates 28 and 30 are connected, in inverted form, to AND gate 32.

Flip-flop 20 is connected in such a manner as to provide a clock signal divider, providing signal HALFCLOCK at node 17, which drives tri-state buffer 14.

Circuit 100 provides three distinct output signals ("High In", "Low In", and "Open", driven by gates 28, 30, and 32, respectively) that are forwarded within the device. Input signal stability for more than two clock cycles is required for two of the input states (input high and input low), and where such stability is not found, a weakly driven but stable third signal ("Open") is provided.

The function of circuit 100 is most effectively illustrated with reference to the timing diagrams of FIGS. 3, 4 and 5. It should be noted that the timing diagrams are somewhat idealized in that the gate and buffer propagation delays are not reflected. Since each of flip-flops 20, 24 and 26 receives an oscillating signal across line 16, and since each of these flip-flops is responsible for the outputs of gates 28, 30 and 32, the three monitored signals HIGH IN, LOW IN and OPEN will only transition at positive clock edges (i.e., when the signal on line 16 goes high). Signal INPUT is found at node 11. Signal HALFCLOCK is found at node 17 and is the input to tri-state buffer 14.

Figure 3:
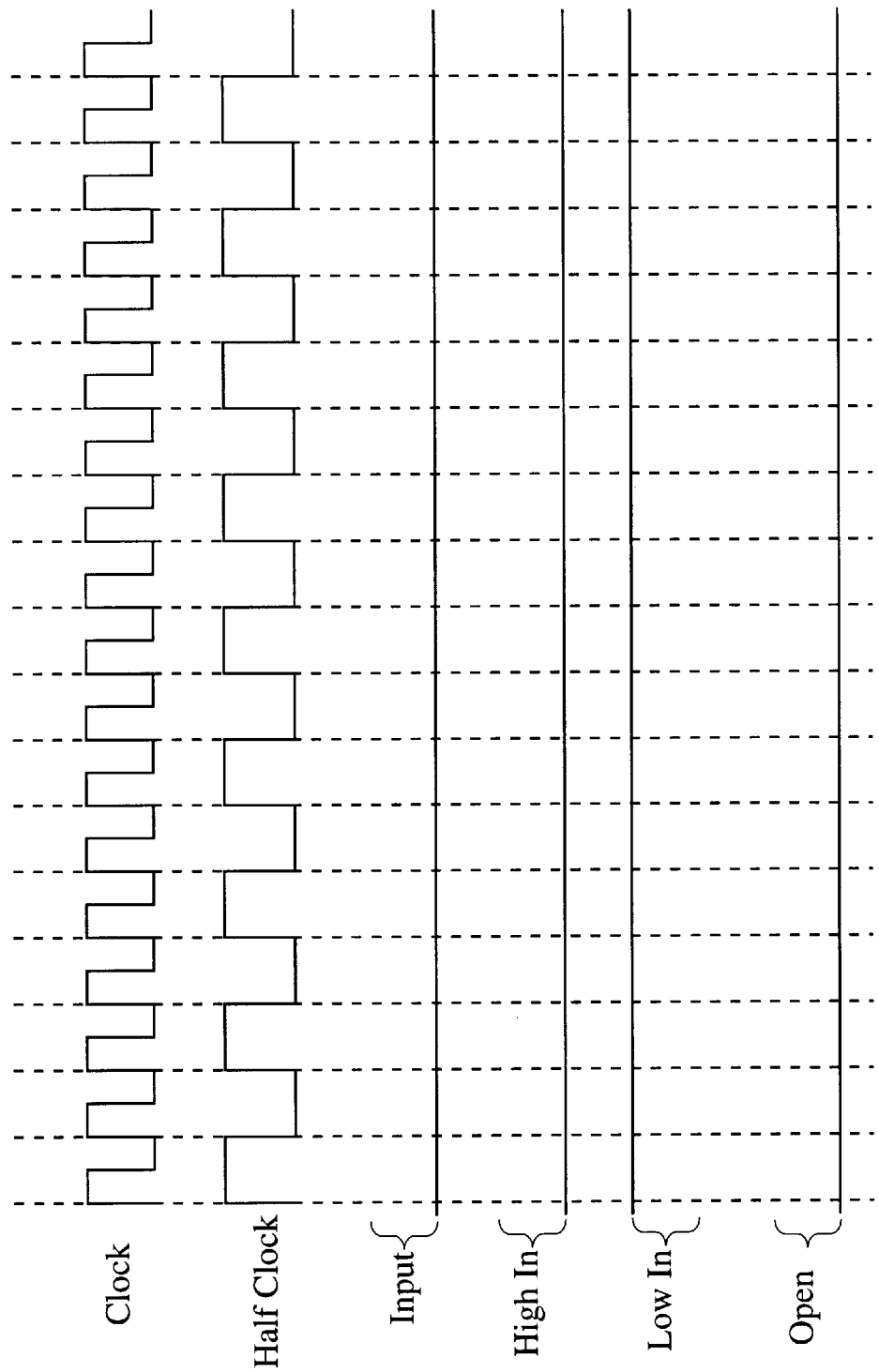
FIGS. 3–5 are timing diagrams illustrating the proper function of a preferred embodiment of the present invention.

Referring to FIG. 3, signal HALFCLOCK is allowed to propagate through buffer 14. However, the presence of resistor 18 ensures that node 11 will only reflect signal HALFCLOCK if the node is not otherwise driven by an external signal at pad 12. If, as we will see later, pad 12 receives a high impedance signal, instead of a logical high or low signal, then signal HALFCLOCK will control node 11.

For now, the logical low INPUT signal propagates through buffer 10 to flip-flop 24 and then, after a single clock cycle, to flip-flop 26. After two clock cycles, the logical low signal at node 11 propagates to the two inverted inputs of gate 30 and forces signal LOW IN high. Since signal OPEN is only high if both signals HIGH IN and LOW IN are low (that is, only if pad 12 is not driving node 11 high or low), signal OPEN remains low.

Figure 4:
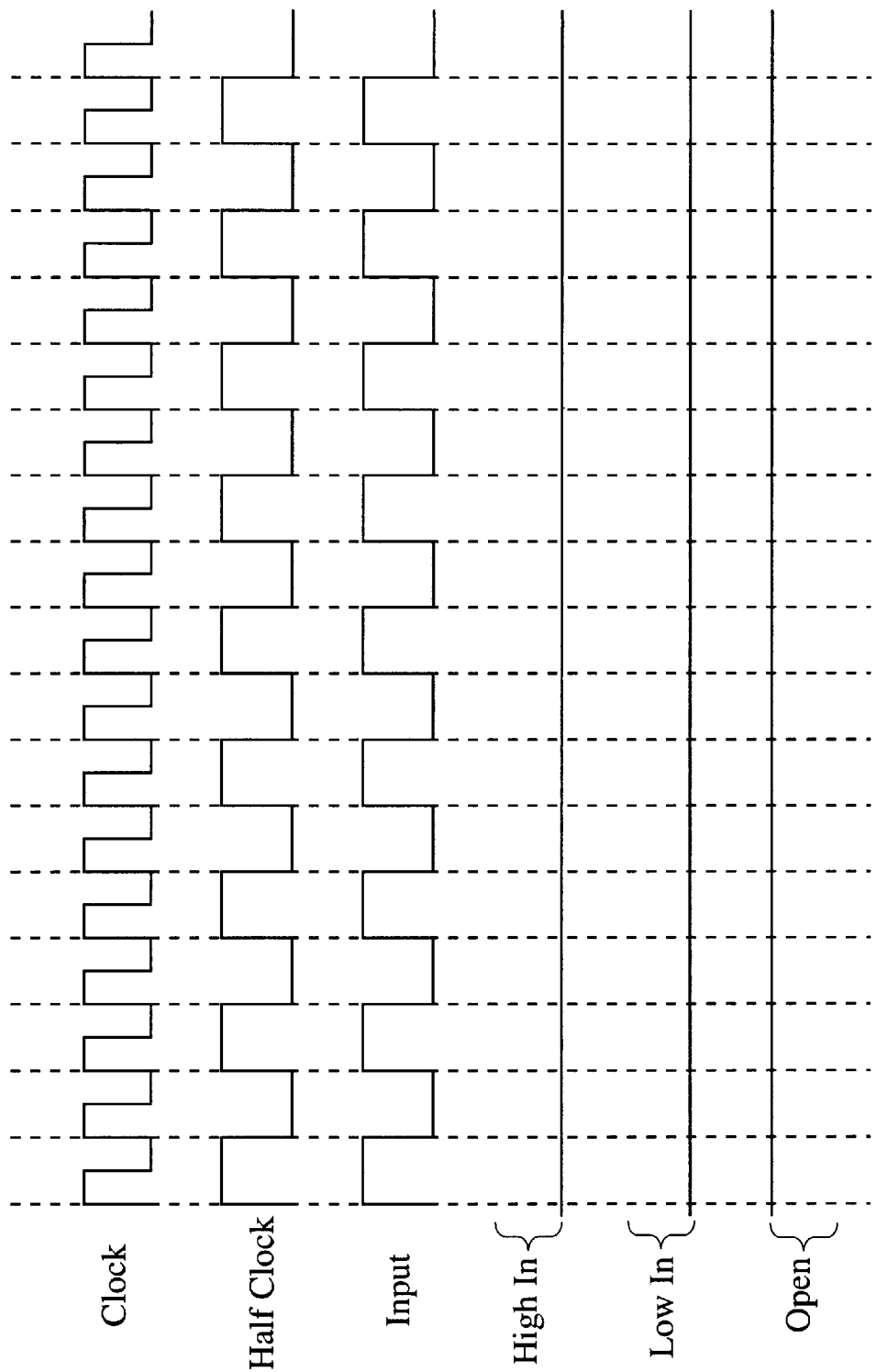

Referring next to FIG. 4, signal INPUT stops driving node 11 and the node instead reflects signal HALFCLOCK received across resistor 18 from buffer 14. The first high signal has propagated to node 29 at the output of flip-flop 24 and caused signal LOW IN to go low, in turn causing signal OPEN to move to a high state. The oscillating HALF-CLOCK signal continues to change and propagate through flip-flops 24 and 26, ensuring that neither of logic gates 28 and 30 receive two logical high signals at any one time, and thereby maintaining signal OPEN at logical high.

Figure 5:
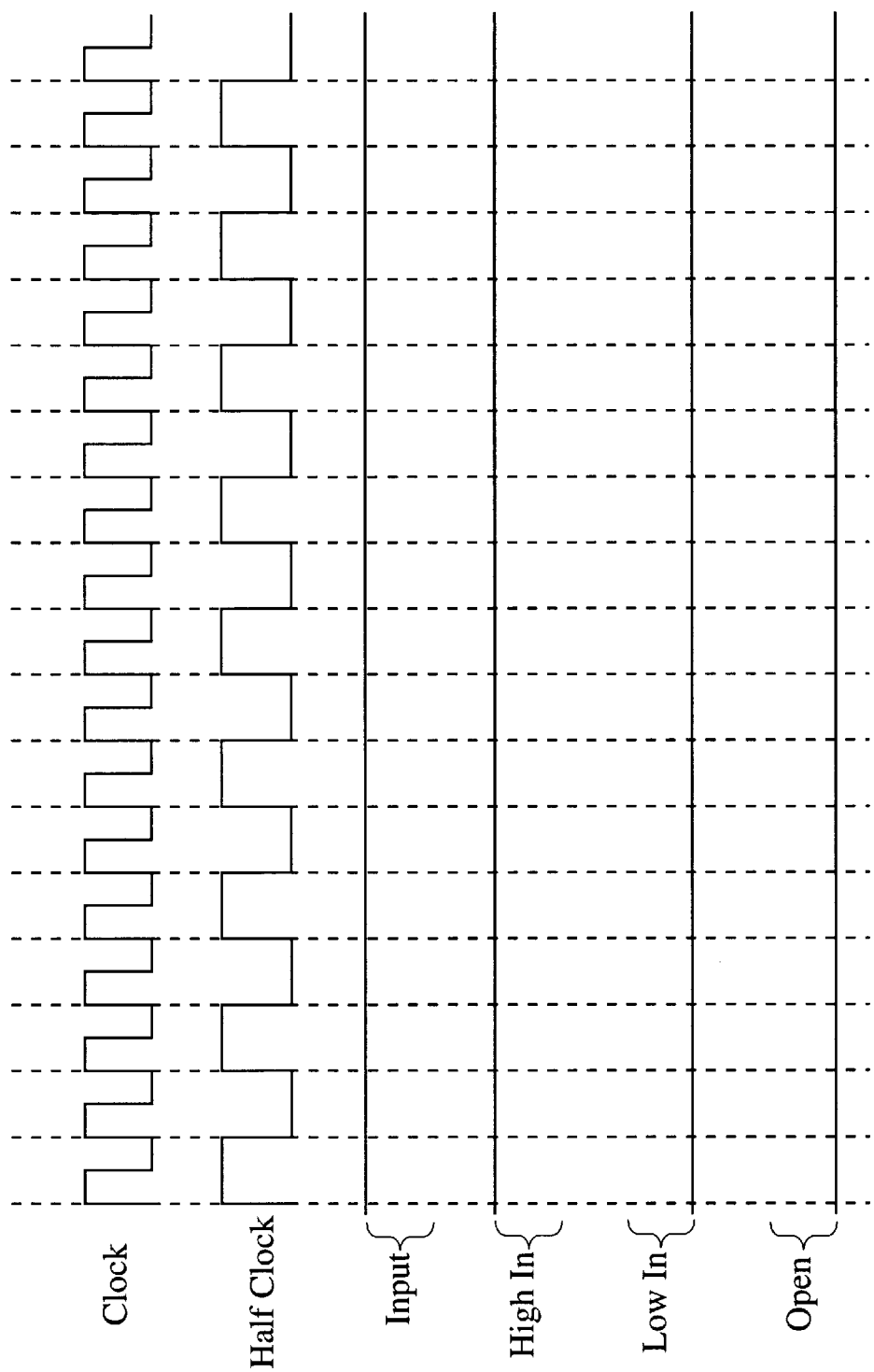

Referring next to FIG. 5, pad 12 begins to drive node 11 again, now with a logical high signal which propagates through the flip-flops as described above. Signal HIGH IN goes high in response to the propagated logical high signals from node 11, and signal OPEN is forced down.

In this manner, use of an internal signal to weakly drive a digital input pin creates a third input state by recognizing that the input pin is following the oscillating signal. Since this circuit may be duplicated for every pin on a device for which two cycle delays do not affect performance, availability of a third input state on N inputs allows $3^N$ input codes as opposed to $2^N$ for the conventional "high" and "low" levels normally available. An internal signal is used to weakly drive the input pin such that it can easily be overdriven to a logic high or low signal for the two conventional states. The present invention therefore provides more usable input codes for mode or status inputs.

A circuit according to the present invention may also be used with changing inputs, provided that the inputs remain stable for more than two clock cycles. The input state may be invalid for two clock cycles after such transitions.

While the present invention has been described with reference to certain preferred embodiments, those skilled in the art will recognize that various modifications and other embodiments may be provided. For example, an element could be added to allow everything in circuit 100 to be optionally bypassed except for the prior art I/O pad 12 and buffer 10, thereby allowing the input signal to propagate into the device without the delay presented by the flip-flops. Such a bypass element could be activated only after the third state made available by the present invention has been utilized. Deasserting signal "Enable Test" shuts off buffer 14 when I/O pad 12 is used as an output pad driven by output buffer 13. "High In", "Open" and "Low In" can be registered if desired to maintain their values from when "Enable Test" was asserted. Also, even though the preferred embodiment is optimized to handle time-insensitive, asynchronous input signals such as control signals, one skilled in the art to which the present invention pertains will understand that such limitations could be easily avoided in an alternative embodiment. These and other embodiments are intended to fall within the scope of the present invention, and these and other variations upon and modifications to the embodiment described herein are provided for by the present invention as limited only by the following claims.

What is claimed is:

1. In an integrated circuit device including a pad for receiving an input signal, a multi-state input drive circuit comprising:

means for receiving a first input signal from the said;

means for receiving a second input signal;

means for resynchronizing said first input signal using said second input signal as a resynchronization clock;

means for forwarding the first input signal, said means for forwarding including means for triggering, in response to said first signal, either of first and second output signals, said output signals being forwarded within said device and being responsive to a logical state of said first input signal; and means for triggering a third output signal only when said first signal is not provided by said pad.

2. The circuit of claim 1 wherein said means for triggering comprises flip-flops.

3. The circuit of claim 1 wherein said second input signal is provided by a clock divider receiving an oscillating signal.

4. The circuit of claim 1 wherein said second input signal is an oscillating signal.

5. The circuit of claim 1 wherein said second input signal is generated within said device.

6. The circuit of claim 1 wherein said second input signal is generated outside said device.

7. An input circuit for a logic device, said circuit comprising:

a first input terminal for receiving a first signal, the first input terminal having one of three states, one such state being a high impedance state;

a second input terminal for receiving a second signal;

means for resynchronizing said first signal using said second signal as a resynchronization clock; and means, connected to said first input terminal, for forwarding said second signal instead of said first signal when said first input terminal is in said high impedance state.

8. In an integrated circuit device including a pad for receiving a first input signal, a method of providing three distinct output signals, said method comprising:

receiving said first input signal from the pad;

forwarding said first input signal to an input circuit;

receiving a second input signal;

resynchronizing said first input signal using said second input signal as a resynchronization clock;

triggering, in response to receipt of said resynchronized first signal, either of first and second output signals, said output signals being forwarded within said device and being responsive to the logical state of said first input signal; and triggering a third output signal only when said first signal is not provided by said pad.

9. The method of claim 8 wherein the first triggering step is performed by flip-flops.

10. The method of claim 8 wherein said second input signal is received by a clock divider.

11. The method of claim 8 wherein said second input signal is an oscillating signal.

12. The method of claim 8 wherein said second input signal is generated within said device.

13. The method of claim 8 wherein said second input signal is generated outside said device.

14. A method of receiving and forwarding an input signal, said method comprising:

receiving a first signal at an input terminal having one of three states, one such state being a high impedance state;

receiving a resynchronizing signal;

resynchronizing said first signal using said resynchronizing signal as a resynchronization clock; and forwarding a second signal instead of said first signal when said input terminal is in said high impedance state.

* * * * *